United States Patent [19]

Hiraiwa et al.

[11] Patent Number: 4,802,174
[45] Date of Patent: Jan. 31, 1989

[54] VITERBI DECODER WITH DETECTION OF SYNCHRONOUS OR ASYNCHRONOUS STATES

[75] Inventors: Hisaki Hiraiwa; Eiichi Osawa, both of Kanagawa, Japan

[73] Assignee: Sony Corporation, Tokyo, Japan

[21] Appl. No.: 15,983

[22] Filed: Feb. 18, 1987

[30] Foreign Application Priority Data

Feb. 19, 1986 [JP] Japan .................. 61-34287

[51] Int. Cl.⁴ ............................................. G06F 11/10
[52] U.S. Cl. ..................................................... 371/46
[58] Field of Search .......................... 371/43, 44, 45, 46

[56] References Cited

U.S. PATENT DOCUMENTS

| | | | |
|---|---|---|---|
| 3,789,359 | 1/1974 | Clark, Jr. et al. | 371/46 |
| 3,872,432 | 3/1975 | Bismarck | 371/46 |
| 4,240,156 | 12/1980 | Doland | 371/43 |
| 4,527,279 | 7/1985 | Yasuda et al. | 371/46 X |
| 4,539,684 | 9/1985 | Kloker | 371/46 |
| 4,578,800 | 3/1986 | Yasuda et al. | 371/46 X |
| 4,583,078 | 4/1986 | Shenoy et al. | 371/43 X |
| 4,675,871 | 6/1987 | Gordon et al. | 371/46 |

FOREIGN PATENT DOCUMENTS

| | | |
|---|---|---|
| 139511 | 5/1985 | European Pat. Off. |
| 59-12649 | 1/1984 | Japan . |
| 59-19454 | 1/1984 | Japan . |
| 2123654 | 1/1984 | United Kingdom . |
| 2123655 | 1/1984 | United Kingdom . |

OTHER DOCUMENTS

Cain et al., A VLSI R-½, K-7 Viterbi Decoder, I EEE 1984 National Aerospace and Electronics Conference, May 1984, pp. 20–27.

Primary Examiner—Charles E. Atkinson
Attorney, Agent, or Firm—Hill, Van Santen, Steadman & Simpson

[57] ABSTRACT

The invention relates to a Viterbi decoder for decoding a convolutional code. Branch metrics are normalized, state metrics are calculated from the normalized branch metrics, and the synchronization and asynchronization are determined on the basis of the degree of increase in the calculated state metrics. Thus, the original data can be certainly decoded by a simple hardware without being influenced by the S/N ratio of the communication path.

4 Claims, 5 Drawing Sheets

VITERBI DECODER WITH DETECTION OF SYNCHRONOUS OR ASYNCHRONOUS STATES

BACKGROUND OF THE INVENTION

1. Field of the Invention

The present invention relates to a Viterbi decoder and, more particularly, to means for achieving synchronization in a Viterbi decoder.

2. Description of the Prior Art

A Viterbi decoder is a decoder which uses the Viterbi algorithm to decode convolutional coded data and is known. Since the coding gain of the Viterbi decoder is high, it has been proposed to apply the Viterbi decoder technique to the field of communication, for cases in which the transmitting electric power is severely restricted or the quality of the transmission path is bad. Several techniques concerned with the decoder using the Viterbi algorithm are disclosed in the following U.S. Patents. In particular, the synchronizing technique in such a decoder is disclosed in detail in U.S. Pat. No. 3,872,432. The soft decision technique is described in U.S. Pat. No. 4,240,156 or 4,493,082. The multi-rate branch metric processor using the soft decision technique is also disclosed in U.S. Pat. No. 4,500,994.

When the Viterbi decoder is applied to a transmission path having a fairly low S/N ratio, it is necessary to obtain code synchronizing, between the transmission side and the reception side, so that the Viterbi decoding can be performed. In particular, when no frame sync signal is used, the synchronization must be obtained by the decoder itself on the basis of the reception data.

For this purpose, several methods of discriminating between synchronization and asynchronization are proposed in, for example, "Reports of Technical Researches (CS 82-43), The Institute of Electronics and Communication Engineers of Japan". Among these methods, the method which concerns use of the time-dependent change in state metric is simple in terms of hardware.

However, the conventional method is impractical because it has the drawback that when the S/N ratio of the transmission path is not specified, it is difficult to determine the threshold value which serves as the reference which is required for discriminating between synchronization and asynchronization.

OBJECT AND SUMMARY OF THE INVENTION

It is an object of the present invention to provide a Viterbi decoder which can discriminate between the synchronizing and asynchronizing states in the decoding process, even when the S/N ratio of the transmission path is not previously known, or even when the S/N ratio of the transmission path varies.

According to the invention, this object is accomplished by a Viterbi decoder for decoding convolutional coded data having a predetermined coding ratio by use of a Viterbi algorithm, including a soft deciding circuit for converting reception data into soft decision data; a code block forming circuit for segmenting the soft decision data for every code block corresponding to the predetermined coding ratio; a branch metric calculating circuit for calculating respective branch metrics from the output data from the code block forming circuit; normalizing means for subtracting the minimum one of the respective branch metrics from each of the branch metrics; an arithmetic operating circuit for arithmetically operating state metrics by use of the branch metrics from the normalizing means; and a synchronization detecting circuit for selecting the minimum state metric from among those arithmetically operated state metrics and for discriminating between the synchronizing state and the asynchronizing state, on the basis of a time-dependent change in increase in the selected minimum state metric, wherein when the asynchronizing state is detected by the synchronization detecting circuit, the segment position of the code block in the code block forming circuit is shifted.

The above and other objects and features of the present invention will become apparent from the following detailed description and the appended claims, with reference to the accompanying drawings.

DESCRIPTION OF THE PREFERRED EMBODIMENTS

An embodiment of the present invention will be described hereinbelow with reference to the drawings.

Figure 1:
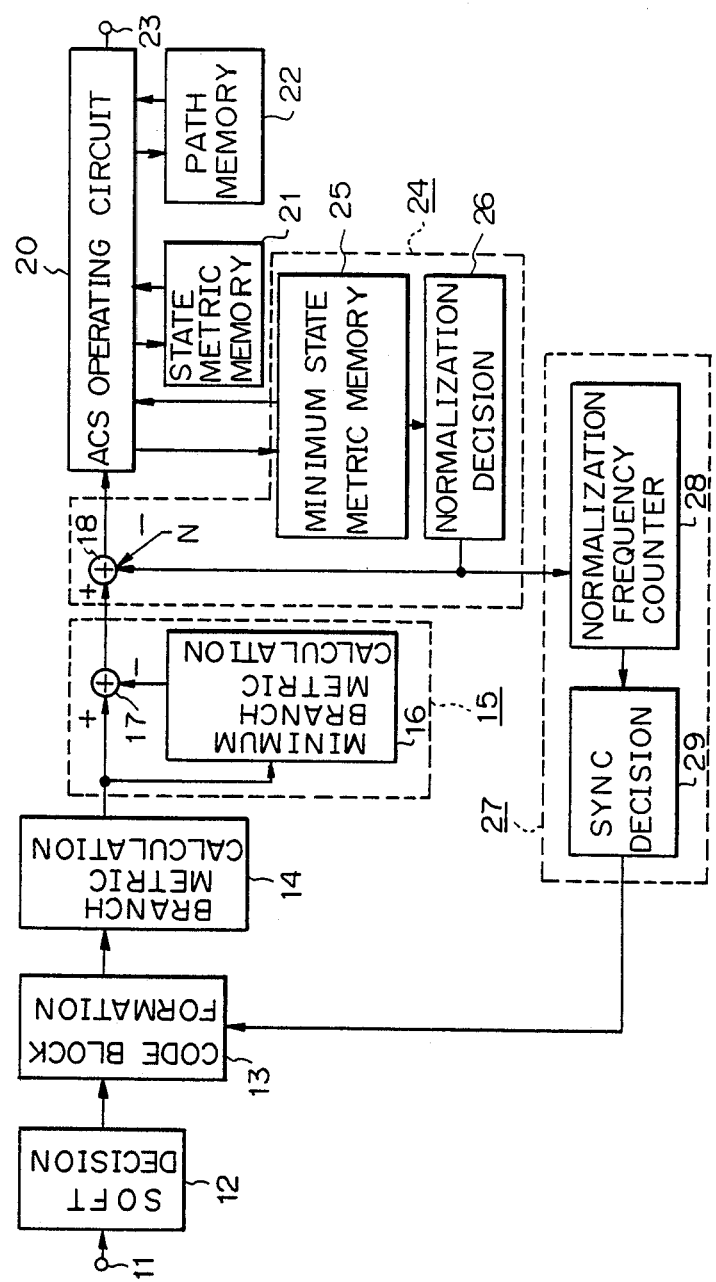
FIG. 1 is a block diagram of a Viterbi decoder incorporating an illustrative embodiment of the present invention.

FIG. 1 shows a block diagram of an overall Viterbi decoder incorporating an illustrative embodiment of the invention.

In FIG. 1, reception data which has been encoded with a convolutional code prior to transmission, is supplied to an input terminal 11.

Figure 2:
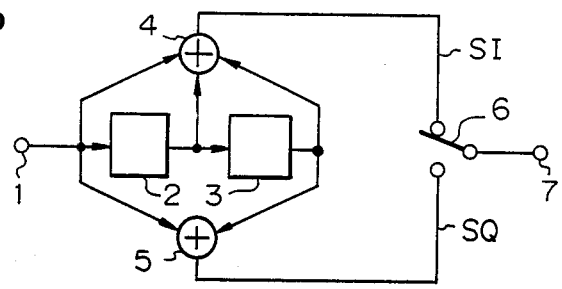
FIG. 2 is a convolutional code encoder for producing a convolutional code.

The convolution coded data produced by a convolutional encoder (at the transmission side) is shown in FIG. 2. An information bit is supplied from an input terminal 1 to a shift register consisting of bit registers 2 and 3. A total of three bits consisting of the input information bit and the previous information bits, respectively stored in the registers 2 and 3, are supplied to an adder or exclusive OR-gate 4 and an exclusive OR of the respective bits is calculated. On the other hand, the input information bit and the information bit stored in the register 3 are supplied to an adder or an exclusive OR-gate 5 and an exclusive OR of these information bits is also calculated. A channel bit $S_I$ is derived from the adder 4 and a channel bit $S_Q$ is obtained from the adder 5. These channel bits are alternately selected by a switching circuit 6 and presented as a composite output at an output terminal 7.

Since the encoder of the convolutional code shown in FIG. 2 converts the information bit of one bit into the channel bits of two bits, the coding ratio is ½. On the other hand, since the information bits of three bits are calculated and encoded, the constraint length k is 3. Further, the internal state of the shift register is simply called the state.

Figure 3:
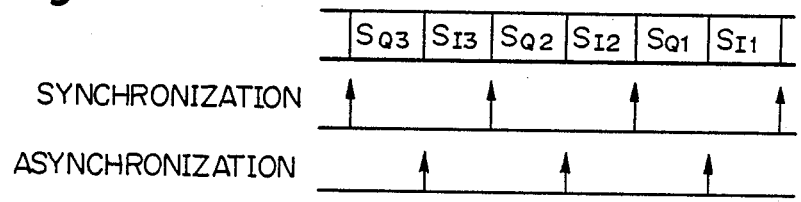
FIG. 3 is a chart showing the synchronizing and asynchronizing states of the convolutional code.

As shown in FIG. 3, illustrating the reception data, each information bit corresponds to a pair of channel bits $S_I$ and $S_Q$ (referred to as code block). On the reception side, it is necessary to correctly know the segmenting position between the code blocks upon decoding. As shown in the "Synchronization" line of FIG. 3, the reception data is correctly segmented into the code blocks and this state is called the synchronizing state. The state in which the reception data is not correctly segmented into the code blocks is called the asynchronizing state, and is shown in the "Asynchronization" line of FIG. 3.

Figure 4:
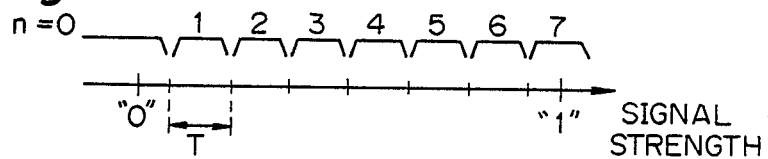
FIG. 4 is a diagram showing a process for segmenting the signal strength of the convolutional code into n levels in order to perform a soft deciding process of the reception data.

The reception data is supplied from an input terminal 11 to a soft deciding circuit 12 (FIG. 1). The channel bit of "0" or "1" of the convolutional coded data produced by the convolutional encoder at the transmission side is added with the noise on the transmission path. For example, the signal level, which is inherently "0", becomes 0.2 or the signal level, which is inherently "1", becomes 0.7. Such a reception signal is not directly returned to "0" or "1" but handled as the analog value and this process is called the soft decision. In this embodiment, as shown in FIG. 4, the analog value is assigned to eight values (r=0 to 7) each having a step width T. The analog value is converted into digital values $r_I$ and $r_Q$ of three bits. Namely, the data $r_I$ and $r_Q$ respectively corresponding to the channel bits $S_I$ and $S_Q$ are derived from the soft deciding circuit 12.

The output data of the soft deciding circuit 12 is supplied to a code block forming circuit 13. The code block forming circuit 13 converts the serial data $r_I$ and $r_Q$ into parallel data. A decision signal of synchronization/asynchronization is supplied to the code block forming circuit 13 from a code block synchronizing circuit 27, which will be explained hereinafter. The code block forming circuit 13 converts the serial data into the parallel data, in response to the timing signal of the synchronizing state. The output data of the code block forming circuit 13 is supplied to a branch metric calculating circuit 14.

The branch metrics are calculated in the branch metric calculating circuit 14. There are four kinds of combinations (00), (01), (10), and (11) as the combinations ($S_I$, $S_Q$) of the channel bits which are received. Four pairs of those bits are called branches. The branch metric is the distance between the pair of received channel bits and each branch. In this embodiment, the branch metrics are calculated as follows since the signal level of the reception data is assigned to eight values.

$Bm_{00} = r_I + r_Q$ $Bm_{01} = r_I + (7 - r_Q)$ $Bm_{10} = (7 - r_I) + r_Q$ $Bm_{11} = (7 - r_I) + (7 - r_Q)$

The branch metrics obtained by the branch metric calculating circuit 14 are supplied to a branch metric normalizing circuit 15. The normalizing circuit 15 comprises: a minimum branch metric calculating circuit 16 for calculating the minimum value among the four branch metrics calculated; and a subtractor 17 for subtracting the minimum value from each branch metric. Namely, assuming that the minimum one of the four branch metrics is $Bm_{MIN}$, the normalizing process of $Bm_{jk} - Bm_{MIN} + Bm_{jk}$ is executed. In the Viterbi algorithm, the absolute value of the branch metric is not significant.

The output signal of the branch metric normalizing circuit 15 is supplied to an ACS (Add Compare Select) operating circuit 20 through a subtracter 18. A state metric memory circuit 21 and a path memory circuit 22 are provided in connection with the ACS operating circuit 20. The decoded output is obtained at an output terminal 23 of the ACS operating circuit 20.

When the constraint length k is 3, there are four states, corresponding to the four possible states of the shift register of the convolutional encoder. The ACS operation circuit 20 obtains the distance (state metric) between each state and the reception data. The state metric denotes that as the value of the state metric is small, the probability of this state is large. The state metrics are stored into the state metric memory circuit 21.

A method of calculating the state metrics will now be described with reference to FIG. 5.

Figures 5A, 5B:
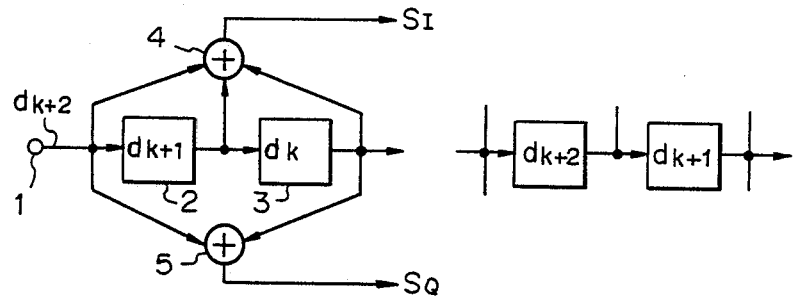
FIGS. 5A, 5B and 6 are diagrams for explaining calculations of state metrics.
Figure 6:
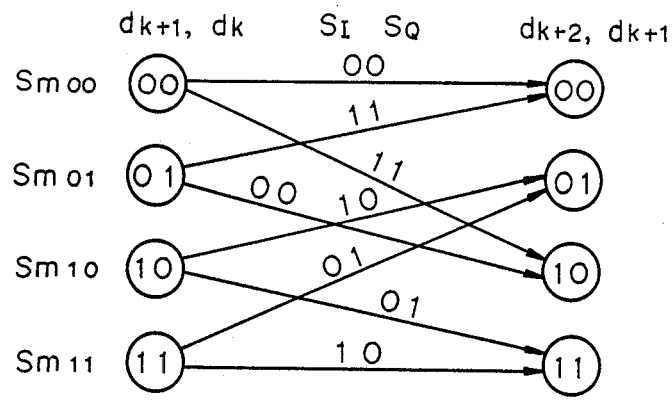

FIGS. 5A and 5B illustrate encoding before transmission. As shown in FIG. 5A, the information bit $d_{k+2}$ is input to the convolutional encoder and the channel bits $S_I$ and $S_Q$ are transmitted. Then the shift register is shifted by 1 bit to assume a state as shown in FIG. 5B. When this data is received at the reception side, all combinations as shown in FIG. 6 are considered and the respective state metrics are calculated. The state metrics $Sm_{00}$, $Sm_{01}$, $Sm_{10}$, and $Sm_{11}$ which have already been calculated in the preceding step (these state metrics are all 0 at the start of reception) are stored in the state metric memory circuit 21.

There are two possibilities in which the state ($d_{k+2}$, $d_{k+1}$) comes to (00) after the channel bits $S_I$ and $S_Q$ are received: namely, the first case where the shift register is previously in the state (00) and "0" is supplied as the information bit $d_{k+2}$ and the channel bits (00) are transmitted, so that the shift register becomes the state (00); and the second case where the shift register is previously in the state (01) and "0" is supplied as the information bit $d_{k+2}$ and the channel bits (11) are transmitted, so that the shift register becomes the state (00). The former state metric is obtained as ($Sm_{00} + Bm_{00}$) and the latter state metric is derived as ($Sm_{01} + Bm_{11}$). $Bm_{00}$ and $Bm_{11}$ are the branch metrics. The state metric having a smaller value between these two state metrics is considered to be the path which is more probable. Therefore, by selecting the path which is considered to be more probable, the new state metric $Sm_{00}$ is derived. Namely, $Sm_{00}(new) = MIN(Sm_{00} + Bm, Sm_{01} + Bm)$ On the other hand, the value $d_k$ (0 in the former case, 1 in the latter case) which is output from the shaft register is stored into the path memory circuit 22 as the path (surviving path) regarding the state (00).

The foregoing state metrics are similarly calculated with respect to the other states (01), (10), and (11), so that the paths of the respective states are obtained. The paths obtained are stored into the path memory circuit 22. The past paths, to an extent which is four to five times as large as the constraint length k are continuously stored in the path memory circuit 22, which is updated with each new item of path data. The path corresponding to the minimum state is selected from among the paths stored and is used as the decoder output.

The maximum likelihood decoding which is executed by the foregoing ACS operating circuit 20, state metric memory circuit 21, and path memory circuit 22, is known as the Viterbi algorithm.

A minimum state metric memory circuit 25 is provided in connection with the ACS operating circuit 20. The minimum state and the state metric are stored in the memory circuit 25. The output of the memory circuit 25 is supplied to a normalization decision circuit 26. The normalization decision circuit 26 detects the minimum value of the state metric and detects when such minimum becomes a predetermined value N (e.g., 7) or larger. The normalization signal is supplied from the normalization decision circuit 26 to the subtractor 18 and to a normalization frequency counting circuit 28.

When the normalization signal is supplied to the subtractor 18, it subtracts the predetermined value N from the output of the branch metric normalizing circuit 15. Due to the normalization of the state metric, the state metric memory circuit 21, which stores the state metric, cannot overflow. Since only the relative value of the state metric is effective in the algorithm, a predetermined value N may be subtracted from all of the state metrics without affecting the result. When the S/N ratio of the reception data (this S/N ratio is referred to as the $E_s/N_0$, in which $E_s$ denotes an energy per bit to be transmitted and $N_0$ is a single sided noise power spectrum density) is low, the increase ratio of the state metric increases and the frequency of normalization also rises.

The normalization signal from the normalization decision circuit 26 is counted by the normalization frequency counting circuit 28 and the count value is supplied to a synchronization decision circuit 29. The counter 28 functions as an accumulator to accumulate the value of the normalization signal, over a predetermined number of bits of reception data, for example 128. The content of the counter 28 is referred to as the normalization frequency. When the normalization frequency is smaller than the predetermined threshold value, the synchronizing state is detected or recognized. When the normalization frequency is larger than the threshold value, the asynchronizing state is recognized. The code block sychronizing circuit 27 is composed of the normalization frequency counting circuit 28 and the synchronization decision circuit 29. The decision information of the synchronization and asynchronization formed by the code block synchronizing circuit 27 is supplied to the code block formation circuit 13. In the code block synchronizing circuit 27, when the asynchronizing state is detected, the timing pulse for segmenting the channel bit into the code blocks is shifted by one bit, to assume the synchronizing state.

Figure 7A:
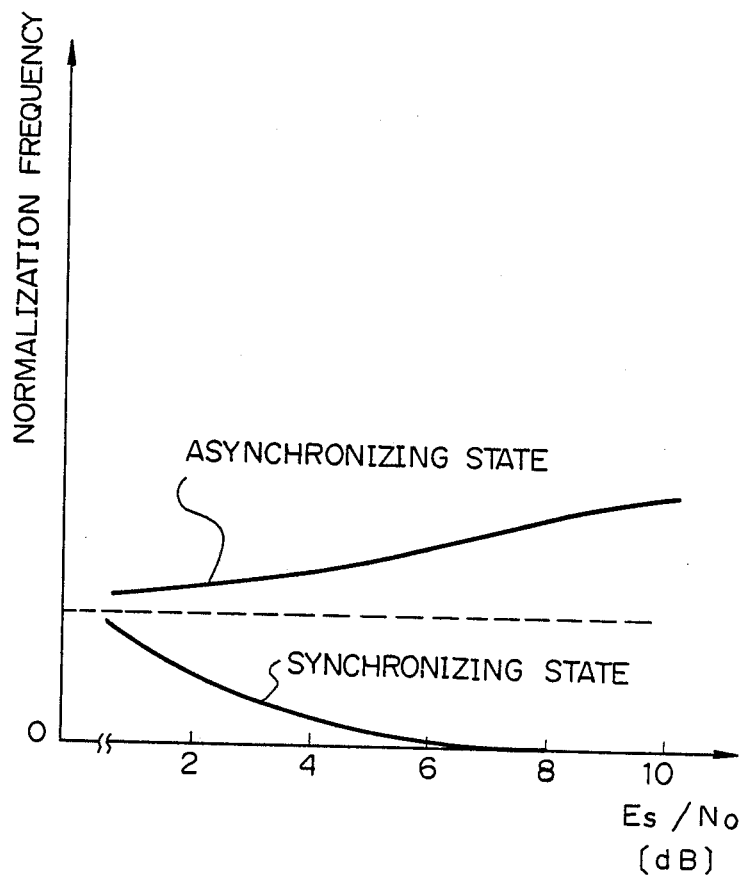
FIG. 7A shows a graph of the normalization frequency when the normalization of branch metrics is performed in accordance with the invention.

As described above, according to the foregoing embodiment, the branch metrics are normalized by the branch metric normalizing circuit 15. Therefore, when the synchronization or asynchronization are discriminated on the basis of the normalization frequency of the state metrics, the threshold value can be easily set. FIG. 7A shows the normalization frequency of the state metrics accordingly to the invention, in a case in which the branch metrics are normalized. As shown in FIG. 7A, the normalization frequency in the synchronizing state gradually decreases as the value of $(E_s/N_0)$ increases. On the contrary, the normalization frequency in the asynchronizing state gradually increases as the value of $(E_s/N_0)$ increases. Therefore, in the synchronization decision circuit 29, as shown by a broken line in FIG. 7A, by comparing the normalization frequency which is supplied from the normalization frequency counting circuit 28 using a constant threshold value as a reference, irrespective of the single sided noise power spectrum density $(E_s/N_0)$, it is possible easily to determine whether the reception data is in the synchronizing state or the asynchronizing state.

Figure 7B:
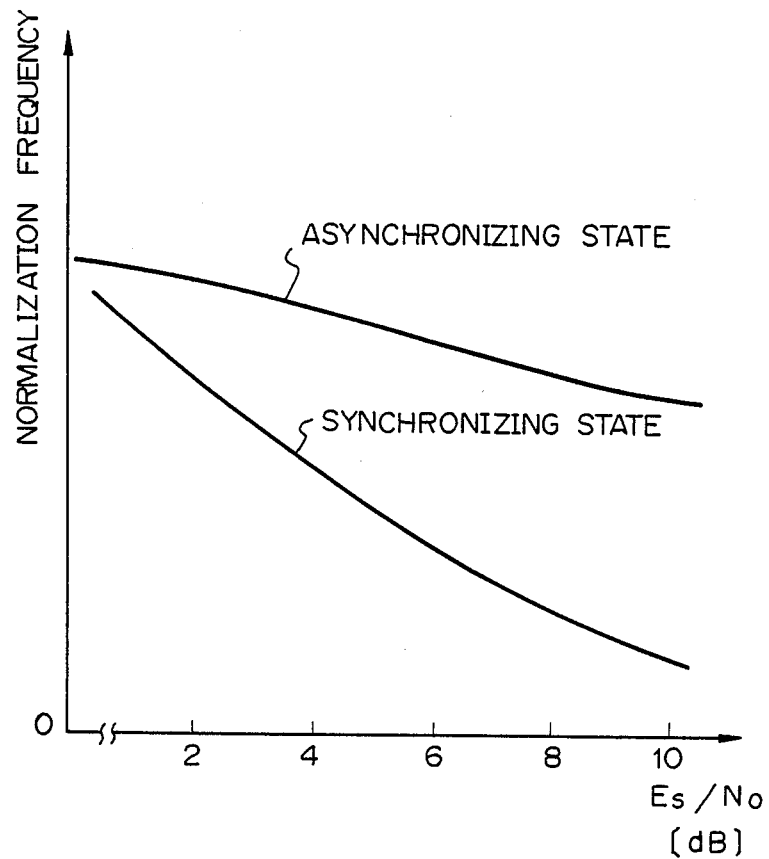
FIG. 7B shows a graph of the normalization frequency of branch metrics in a conventional Viterbi decoder.

If the branch metrics are not normalized, as in the conventional Viterbi process, as shown in FIG. 7B, the normalization frequency of the state metrics of each of the synchronization and asynchronization doesn't cross x axis and both of them decrease. Therefore, in the case of the transmission path whose $(E_s/N_0)$ cannot be preliminarily known or the transmission path whose $(E_s/N_0)$ varies, it is difficult to set the threshold value, so this promotes the erroneous operation following a misdecision between synchronization and asynchronization.

The reason that the normalization frequencies of the state metrics differ in dependence on whether the branch metrics are normalizated or not as mentioned above will now be described. For simplicity, the description will be made hereinafter with respect to the cases where the S/N ratio (i.e., $E_s/N_0$) is infinite, and where it is bad, in both the synchronizing state and the asynchronizing state.

First, the state is classified into cases (1) to (8) as shown in Table 1.

TABLE 1

| Synchronization/ Asynchronization | Synchronization | | Asynchronization | |
| --- | --- | --- | --- | --- |
| S/N ratio ($E_s/N_0$) | ∞ | Bad | ∞ | Bad |
| When the branch metrics are normalized | (1) | (2) | (3) | (4) |
| When the branch metrics are not normalized | (5) | (6) | (7) | (8) |

The soft decision data $r_I$ and $r_Q$ which are derived from the soft deciding circuit 12 are predetermined values of 0 and 7 when the S/N ratio is good (i.e., infinity), while they are predetermined values within a range of 0 to 7 when the S/N ratio is bad.

Table 2 shows the results of the calculations of the branch metrics ($Bm_{00}$, $Bm_{01}$, $Bm_{10}$, $Bm_{11}$) with respect to examples of the soft decision data $r_I$ and $r_Q$.

In this example, the branch metrics were calculated with respect to the cases where {S/N ratio: ∞, $r_I=0$, $r_Q=0$}

{S/N ratio: bad, $r_I=2$, $r_Q=3$}

TABLE 2

| | Synchronization | | Asynchronization | |
| --- | --- | --- | --- | --- |
| | ∞ | Bad | ∞ | Bad |
| | Branch metrics are normalized | | | |
| $Bm_{00}$, $Bm_{01}$ | 0, 7 | 0, 1 | 0, 7 | 0, 1 |
| $Bm_{10}$, $Bm_{11}$ | 7, 14 | 3, 4 | 7, 14 | 3, 4 |
| | Branch metrics are not normalized | | | |
| $Bm_{00}$, $Bm_{01}$ | 0, 7 | 5, 6 | 0, 7 | 5, 6 |

TABLE 2-continued

| | Synchronization | | Asynchronization | |
|---|---|---|---|---|
| | ∞ | Bad | ∞ | Bad |
| $Bm_{10}$, $Bm_{11}$ | 7, 14 | 8, 9 | 7, 14 | 8, 9 |

The following points will be understood from Table 2.

(i) When the branch metrics are not normalized, the average value of the four branch metrics is 7 and as the S/N ratio is bad, the distribution of four values is small.

(ii) When the branch metrics are normalized, the average value of the four branch metrics is small as the S/N ratio is bad. The distribution of four values is also small as the S/N ratio is bad.

Figure 8:
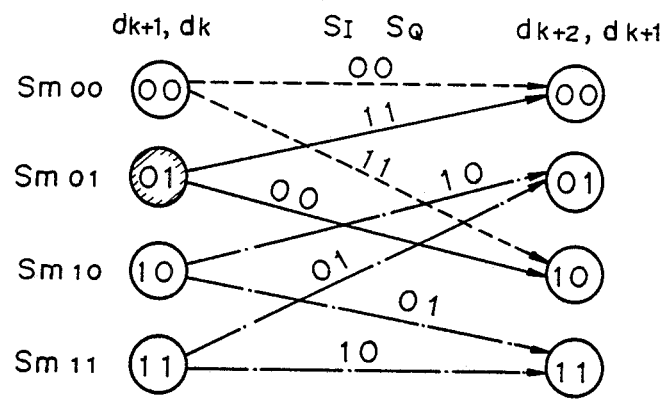
FIG. 8 is a diagram for explaining the effect of normalization of branch metrics.

The case of the synchronizing state (i.e., the foregoing cases (1), (2), (5), (6)) will be explained. When the S/N ratio is infinite, one of two paths shown by solid lines which are branched from the maximum likelihood state $Sm_{01}$ (namely, the state having the minimum state metric) at a certain time point indicated by oblique lines in FIG. 8 is the correct path and the branch metric of this path is certainly 0, so that the increase ratio of the minimum state metric becomes 0. Thus, the normalization frequency of the stae metrics is also 0.

However, when the S/N ratio deteriorates, the branch metric corresponding to the correct path which is branched from the maximum likelihood state is not always 0; therefore, the minimum state metric increases. On the other hand, when the branch metrics are normalized, the minimum one of the four branch metrics is set to 0 (in many cases, the path corresponding to the minimum branch metric is the correct path), so that the increase ratio of the minimum state metric decreases.

An explanation will now be made with respect to the case where the branch metrics are not normalized in the asynchronizing state and the S/N ratio is infinite (the case (7)). The respective branch metrics corresponding to two paths which are branched from the maximum likelihood state at a certain time point are (0, 14) or (7, 7). In the asynchronizing state, the probability when those branch metrics become either one of those pairs is ½. In the case of the former pair, since the path corresponding to the branch metric 0 is selected, the increase in the minimum state metric is 0. However, in the case of the latter pair, the path of which the minimum state metric increases by seven, or the path which is branched from another state $Sm_{00}$ (i.e., the path indicated by a broken line in FIG. 8) becomes the maximum likelihood state. In any case, the minimum state metric increases.

When the S/N ratio deteriorates (the case (8)), the minimum branch metric approaches 7; thus, the increase ratio of the minimum state metric increases.

When the branch metrics are normalized in the asynchronizing state and also when the S/N ratio is infinite, i.e., the case (3) is substantially the same as the foregoing case (7).

When the S/N ratio deteriorates (the case (4)), the case where the branch metrics $Bm_{00}$, $Bm_{01}$, $Bm_{10}$, and $Bm_{11}$ are respectively (0, 1, 3, 4) as shown in e.g., Table 2 will now be considered. When the branch metrics for two paths which are branched from the maximunm likelihood state are 0 or 4, the path corresponding to the branch metric 0 is selected. Consequently, the minimum state metric doesn't increase. On the other hand, when the branch metrics for two paths which are branched from the maximum likelihood state are 1 or 3, the path for the branch metric 1 is selected, so that the minimum state metric increases by one, and another state becomes the maximum likelihood state.

As mentioned above, in the case (4), there is a tendency such that the increase ratio in the minimum state metric is smaller than that in the case (3). This situation is opposite to the case where the branch metrics are not normalized.

As described above, by normalizing the branch metrics, the characteristic of the change in normalization frequency to the change in $(E_s/N_0)$ as shown in FIG. 7(A) is derived.

Although the increase ratio in the minimum state metric has been detected from the normalization frequency of the state metrics in the foregoing embodiment, the increase ratio in the minimum state metric may be also directly detected without using the normalization frequency.

On the other hand, the subtracter for normalizing the state metrics may be also arranged on the signal path which departs from the state metric memory circuit 21 and reaches the ACS operating circuit 20.

The embodiment of the invention has been described above on the assumption that the constraint length is 3 and the coding ratio is ½. However, the invention is not limited to these values. For example, the constraint length may be 7 and the coding ratio may be ⅓.

According to the invention, by normalizng the branch metrics, it is possible to easily set the threshold value which is used to discriminate between the synchronizing and the asynchronizing states upon decoding. Thus, the synchronization and asynchronization can be corrected detected so that synchronization can be secured.

Although the present invention has been shown and described with respect to a preferred embodiment, various changes and modifications which are obvious to a person skilled in the art to which the invention pertains are deemed to lie within the spirit and scope of the invention.

What is claimed is:

1. A Viterbi decoder for decoding convolutional coded data having a predetermined coding ratio by use of a Viterbi algorithm, comprising:
   a soft deciding circuit for converting reception data into soft decision data;
   a code block forming circuit for segmenting said soft decision data for each code block, corresponding to said predetermined coding ratio;
   a branch metric calculating circuit for calculating a plurality of respective branch metrics from output data produced by said code block forming circuit;
   normalizing means for subtracting the minimum one of said respective branch metrics from each of said branch metrics;
   an arithmetic operating circuit for arithmetically operating state metrics by use of the branch metrics from said normalizing means;
   a synchronization detecting circuit for selecting the minimum one of said arithmetically operated state metrics and for detecting the synchronizing state or asynchronizing state on the basis of a time-dependent change in increase in said selected minimum state metric, and
   shifting the segmenting position of the code block in said code block forming circuit when the asynchronizing state is detected by said synchronization detecting circuit.

2. Apparatus according to claim 1, including counter means for counting the normalization frequency, said synchronization detecting circuit being connected to said counter means and responsive thereto for detecting said asynchronous state.

3. A Viterbi decoding method of decoding convolutional coded data having a predetermined coding ratio by use of a Viterbi altorithm, comprising the steps of:

converting reception data into soft decision data;

segmenting said soft decision data for every code block corresponding to said predetermined coding ratio;

calculating a plurality of respective branch metrics from output data which is obtained by said code block forming step;

subtracting the minimum one of said respective branch metrics from each of said branch metrics;

arithmetically operating state metrics by use of the branch metrics which are obtained by said subtracting step; and selecting the minimum one of said arithmetically operated state metrics and detecting the synchronizing state or asynchronizing state on the basis of a time-dependent change in said selected minimum state metric, and shifting the segmenting position of the code block in said code block forming step when the asynchronizing state is detected bysaid synchronization detecting step.

4. A method of calculating state metrics whereby a plurality of respective branch metrics are calculated upon execution of a Viterbi decoding, and the state metrics are calculated on the basis of said calculated branch metrics, comprising the steps of:

subtracting the minimum one of said respective branch metrics from each of said branch metrics; and calculating the state metrics on the basis of said subtracted branch metrics.

* * * * *